United States Patent
Larson et al.

(10) Patent No.: US 7,464,311 B2
(45) Date of Patent: Dec. 9, 2008

(54) APPARATUS AND METHOD FOR DEVICE SELECTIVE SCANS IN DATA STREAMING TEST ENVIRONMENT FOR A PROCESSING UNIT HAVING MULTIPLE CORES

(75) Inventors: Lee A. Larson, Katy, TX (US); Gary L. Swoboda, Sugar Land, TX (US); Mark B. Rix, Houston, TX (US)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 837 days.

(21) Appl. No.: 10/212,622

(22) Filed: Aug. 5, 2002

(65) Prior Publication Data

US 2004/0054950 A1 Mar. 18, 2004

(51) Int. Cl.
*G01R 31/28* (2006.01)

(52) U.S. Cl. .................................. 714/727; 714/729

(58) Field of Classification Search ............... 711/138; 714/712, 30, 729; 712/227, 36, 22

See application file for complete search history.

(56) References Cited

U.S. PATENT DOCUMENTS

| | | | | |
|---|---|---|---|---|
| 5,247,639 A | * | 9/1993 | Yamahata | 711/138 |
| 5,477,548 A | * | 12/1995 | Beenker et al. | 714/727 |
| 5,970,241 A | * | 10/1999 | Deao et al. | 712/227 |
| 6,055,619 A | * | 4/2000 | North et al. | 712/36 |
| 6,055,649 A | * | 4/2000 | Deao et al. | 714/30 |
| 6,145,072 A | * | 11/2000 | Shams et al. | 712/22 |

* cited by examiner

*Primary Examiner*—David Ton
(74) *Attorney, Agent, or Firm*—Sughrue Mion, PLLC (57) ABSTRACT

In a multi processor environment wherein the processors are capable of implementing a streaming data mode of operation, a technique is provided that reduces the number of bits shifted through the scan chain necessary to select a processor for operating in the streaming data mode. All test control device associated with the processor have an instruction entered therein. After execution of the instruction, all of the processors are entered in a bypass mode of operation. Then, a logic "0" in the bypass register will cause the associated target processor to enter the streaming data mode, while a logic "1" in the bypass register will cause the processor to enter the bypass mode. To select a new target processor, logic "1"s in the bypass register will reset the test control unit and thereafter the entry of a logic "1" will cause the non-target processors to enter the bypass mode, while a logic "0" in a bypass register will select the new target processor (i.e., for operating in the streaming data mode).

14 Claims, 5 Drawing Sheets

APPARATUS AND METHOD FOR DEVICE SELECTIVE SCANS IN DATA STREAMING TEST ENVIRONMENT FOR A PROCESSING UNIT HAVING MULTIPLE CORES

BACKGROUND OF THE INVENTION

1. Field of the Invention

This invention relates generally to the testing of digital signal processing units and, more particularly, streaming trace test and debug techniques for processing units having multi-chip with multiple cores.

2. Background of the Invention

Data processing systems, especially digital signal processing unit are becoming more complex. Specifically, some cards used in the telecommunication industry have 100 devices. The card can include multiple chips, each chip potentially having multiple cores or processors. Already, 1000 cores or processors on a single card are being contemplated by some users. The task of testing and debugging of a processing array is formidable.

Figure 1:
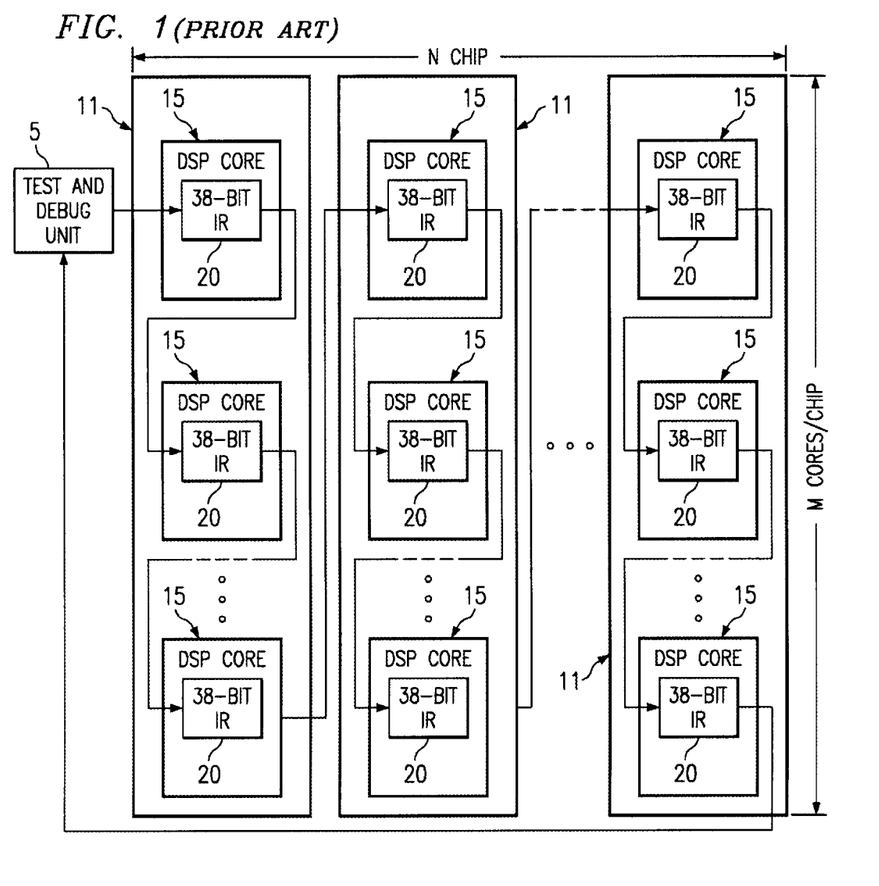
FIG. 1 illustrates the configuration of the streaming pipeline for exchanging test data and commands between test unit and a plurality of cores according to the prior art.

In the past, one approach to the testing of a processing array has been known as streaming. Referring to FIG. 1, an example of a card 10 is shown. The card 10 includes N chips 11. Each of the chips 11 has M cores fabricated thereon. In this example, each of the cores 15 is designated by the same numeral. (As will be clear, the cores 15 can be alike or can be different. Similarly, the fact that each chip has N cores 15 fabricated thereon permits easy computations for comparison.) Each core 15 includes a instruction register 151. Each instruction register 151 is 38 bits in length and is fabricated as a shift register. All of the instruction registers 151 are coupled in series. The instruction registers 151 provide commands to the core 15 of which the instruction register 15 is a unit. The instruction registers have test and diagnostic signals stored therein. The commands and the test and diagnostic signals are, respectively, shifted into instructions registers 151 of the cores 15 and out of the instruction registers 151 of the cores 15. In order to shift a complete set of commands in or a set of data out of the chain of shift registers, N×M×38 clock cycles are required. The chain of instruction registers is coupled to the test and debug unit 5. The test and debug unit executes the instruction to perform meaningful test and debug operations.

Figure 2A:
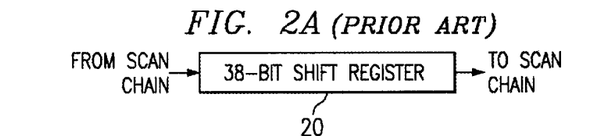

Referring to FIG. 2A, the instruction register 20 of the prior art is illustrated. In the preferred embodiment, the instruction register is 38-bit shift register. The instruction register 20 is coupled in series to the other instruction registers in the scan. The instruction register 20 provides commands to a core 15 and receives test data from the core 15. The commands are shifted by the test and debug unit 5 into the instruction register 20 through intervening instruction registers 20 in the scan chain and the test data is shifted out of the instruction register to the test and debug unit 5 through the intervening instruction registers, i.e., as shown in FIG. 1.

Figure 2B:
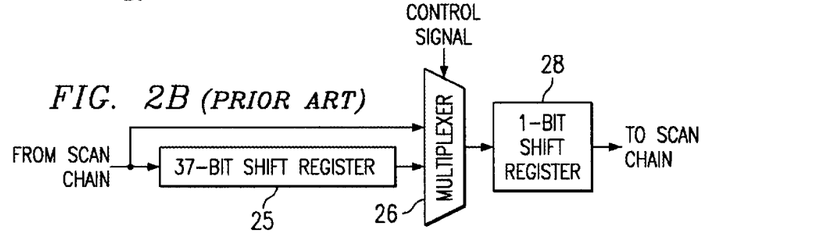
FIG. 2B is an instruction register unit placed in a bypass mode.

Referring to FIG. 2B, an instruction register unit 25, according to the present invention is illustrated. The instruction register unit 25 replaces the instruction register 20 in each core 15. The instruction register unit 25 includes a 37-bit shift register 26 having an input terminal to which scan chain signals are applied. The output terminal of shift register 26 is applied to a first input terminal of multiplexer 27. The input terminal of shit register 26 is coupled to a second input terminal of multiplexer 27. The output terminal of the multiplexer 27 is coupled to an input terminal of a 1-bit shift register 28. The output terminal of shift register 28 is coupled to the next instruction register unit 25 in the scan chain. A control signal applied to the multiplexer 27 determines which multiplexer 27 input terminal is applied to the input of the shift register 28. In the first state, the multiplexer 27 couples the shift register 26 with the shift register 28, thereby creating a 38-bit shift register, 26 and 28, in the scan chain. In the second state, the 37 bit shift register is by-passed and a 1-bit shift register 28 is in the scan chain.

Figure 3:
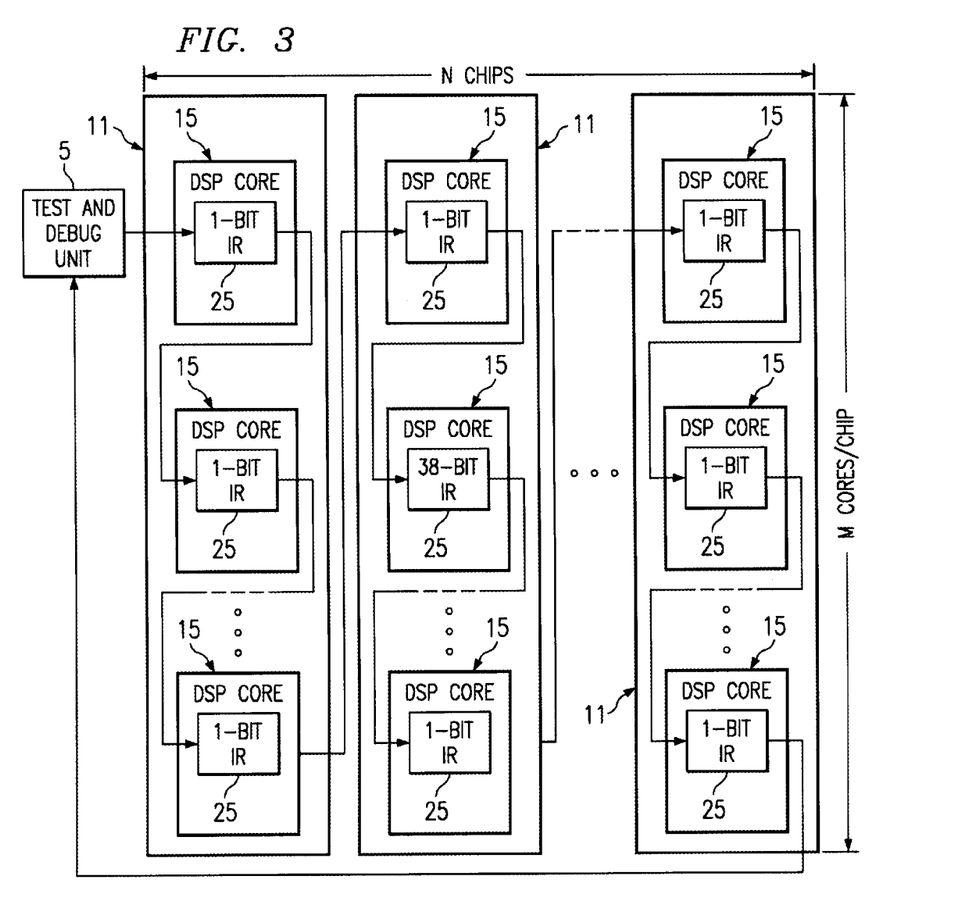
FIG. 3 is a block diagram illustrating the relationship between the instruction register unit and the core of which it is a part according to the present invention.

Referring to FIG. 3, the block diagram of FIG. 1 is replicated with the exception that the instruction registers 20 of all the devices not being tested, have been placed in bypass mode. Instruction register unit 25' is in data streaming mode and acts as a 38-bit shift register. This configuration permits the extraction of test data from one core 15 without the delay of non-selected instruction registers 25. The time to extract the test data from the scan chain is (N×M)+37 clock cycles. This time is to be compared to N×M×38 when the scan chain is implemented with prior art instruction registers.

Figure 4:
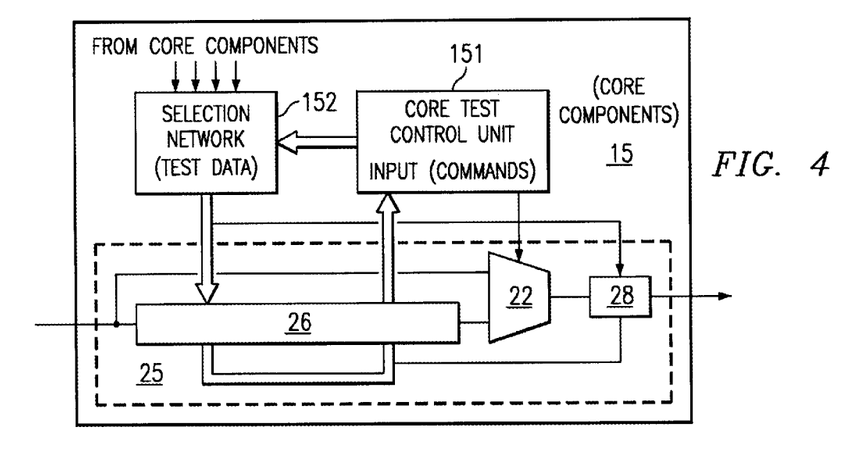
FIG. 4 is a block diagram of a streaming pipeline in which only one of the cores is transmitting test data to the test unit.

Referring to FIG. 4, a block diagram of the components interacting with the instruction register unit 25 in the core is shown. Commands are entered by the test and debug unit 5 on the scan chain and are stored in the 37-bit shift register 26 and the one bit register 28. The combination of the two shift registers 26 and 28 is, for purposes of entering commands in the core 15, the instruction register 20 of the prior art and receives data signals. The logic signals in the two shift registers are entered in a core test control unit 151. The core test control unit 151 processes the logic signals according to the state of the core ctest control unit. The state of the core test control unit 151 is determined by TEST MODE SELECT (TMS) signals and TEST CLOCK (TCK) signals. Typically the command requires a response in the form of test data, i.e., data to be analyzed by the test and debug unit 5.

Figure 5:
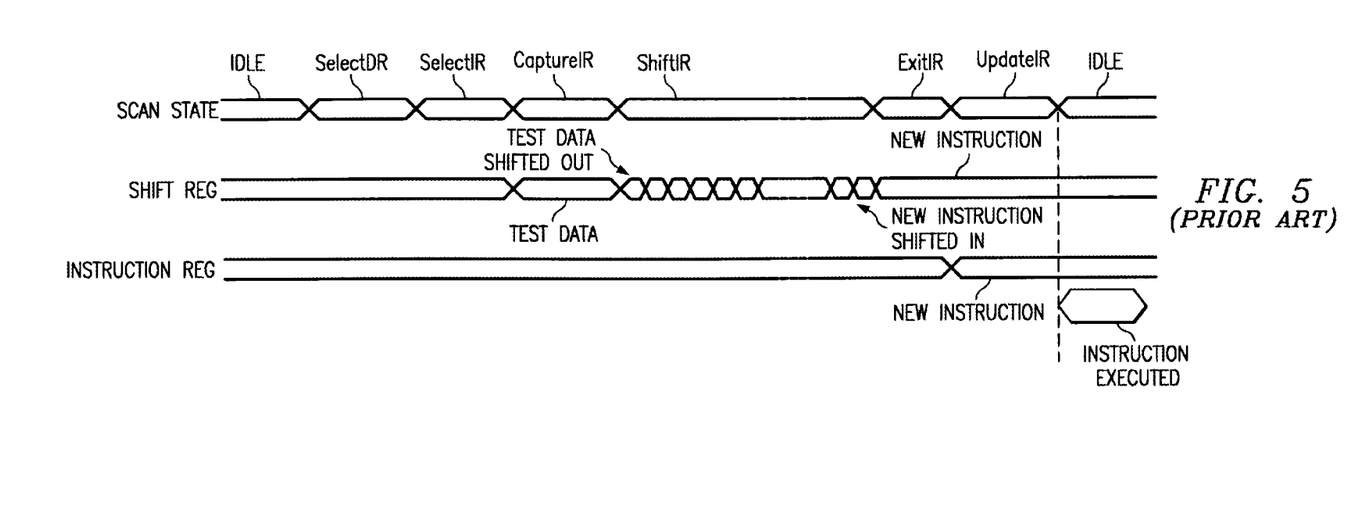
FIG. 5 illustrates the procedure for entering instructions in the core and for removing data therefrom according to the prior art.

FIG. 5 shows a normal scan which loads a single instruction into the shift register and then changes the scan state to load the instruction into the core test control unit. The scan state is then changed again to execute the instruction. The top waveform, labeled scan state, illustrates the states of the core test control unit 151. These states are the result of a sequence of test mode select (TMS) signals that result in a state transition. The middle waveform, labeled shift register, describes the contents of the shift register unit 25. The bottom waveform, labeled instruction register, describes the contents of instruction register Since all devices in the scan chain respond to instruction scans, every scan takes M×N×38 clock cycles. The states are referred to by the JTAG labels and the apparatus is implemented to be compatible with the JTAG standards.

A need has therefore been felt for apparatus and an associated method having the feature of increasing the efficiency of the transfer of instructions and test data to and from multiple processors. It would be a further feature of the apparatus and associated method to increase the efficiency of instructions and data transfer in the data streaming test environment. It is yet another feature of the apparatus and associated method to provide an improved technique for deselecting a first processor and selecting a second processor for implementing a steaming data mode of operation. It is a more particular feature of the apparatus and associated method to provide for an improved boundary scan. It is another particular feature of the present invention to provide a boundary scan that is compatible with JTAG (Joint Test Action Group) protocols.

SUMMARY OF THE INVENTION

The aforementioned and other features are accomplished, according to the present invention, providing a boundary scan instruction that, when executed in a processor having a shift register and a bypass register, results in all of the registers being placed in a by pass mode. Thereafter, the entry of a logic "1" in the shift register results in the associated processor remaining in the bypass mode while a logic "0" entered in the bypass register causes the associated processor to enter the streaming data mode of operation. After completion of the streaming mode operation, the processor is deselected. Logic "1"s are then entered in the bypass registers of all the processors to change the processors to a bypass state. Then logic "1"s are placed in the bypass registers of all the processors except for a new target processor that has a logic "0" entered in the bypass register. As before, the presence of the logic "1"s causes the associated processors to enter a bypass mode, while the logic "0" causes the associated processor to enter into a streaming mode state. The processor includes a test control unit that has states compatible with the JTAG standards. These states are controlled by externally applied signals. The state of the test control unit determines the mode of operation of the processor and the response of the processor to instructions/commands entered by the shift register. The selection of a new target processor can be performed with two signal groups of N×M bits (M×N being the number of processors) as opposed to a full signal group of N×M×R bits, R being the length of the shift register associated with each processor.

Other features and advantages of present invention will be more clearly understood upon reading of the following description and the accompanying drawings and the claims.

BRIEF DESCRIPTION OF THE DRAWINGS

FIG. 2A is instruction register used in a streaming pipeline according to the prior art; while

FIG. 8A is a flow diagram of the operation of streaming data mode, while

DESCRIPTION OF THE PREFERRED EMBODIMENT

1. Detailed Description of the Figures

FIG. 1 through FIG. 5 have been described with respect to the related art.

Figure 6:
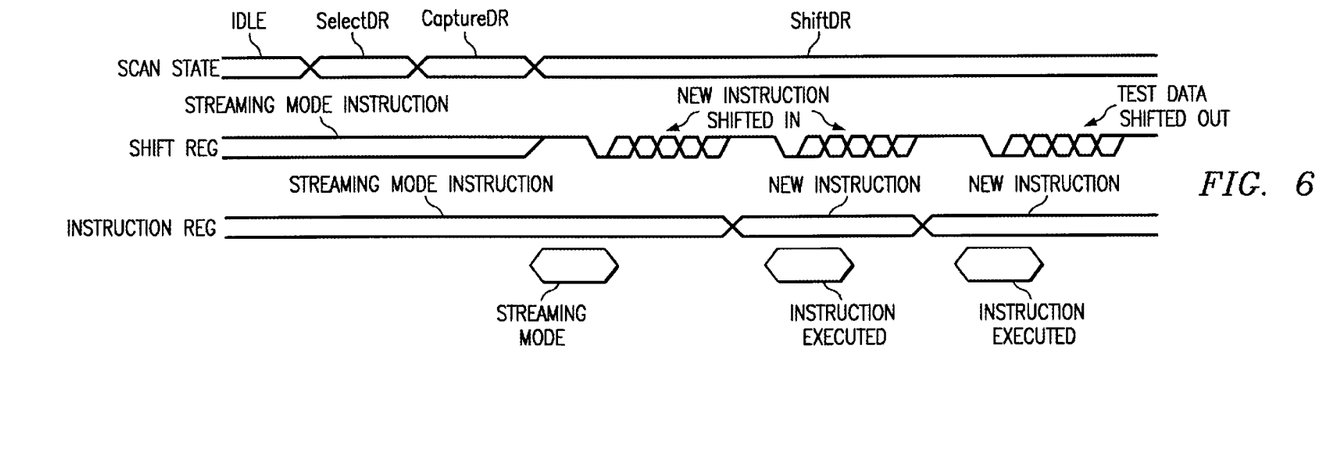
FIG. 6 illustrates the procedure for a streaming mode instruction execution.

FIG. 6 shows the waveforms for the same components as FIG. 5 for streaming mode scans. A streaming instruction is loaded into the instruction register of the device to be tested and a bypass instruction into the instruction register of all the other devices. When instructions get executed all the devices in bypass mode change their shift register lengths to one bit. The device with the streaming instruction does not. When the scan state changes to SHIFT DR, the device enters streaming mode. In this mode, new instructions are detected by the streaming protocol from within the SHIFT DR scan state, and are loaded into the instruction register and executed. Test data can also be returned by the core test control unit while streaming in the SHIFT DR mode. Since all the other devices are in bypass mode, the scan chain length is only M×N+37 bits long.

To further improve transfer efficiency, many streaming instructions can be present in the scan chain, i.e. it is not necessary to do a complete M×N+37 bit scan for each instruction. A new instruction can be started as soon as the last bit of the previous instruction has been shifted into the scan chain. Up to (M×N+37)/k instructions can be in flight at a time where k is the average length of a streaming instruction.

The device remains in the streaming mode until the scan state changes to an UPDATE DR state which cancels streaming mode. Only a single device can be in the streaming mode to prevent test data read out from being interpreted as instructions if another device was in streaming mode.

Figure 7:
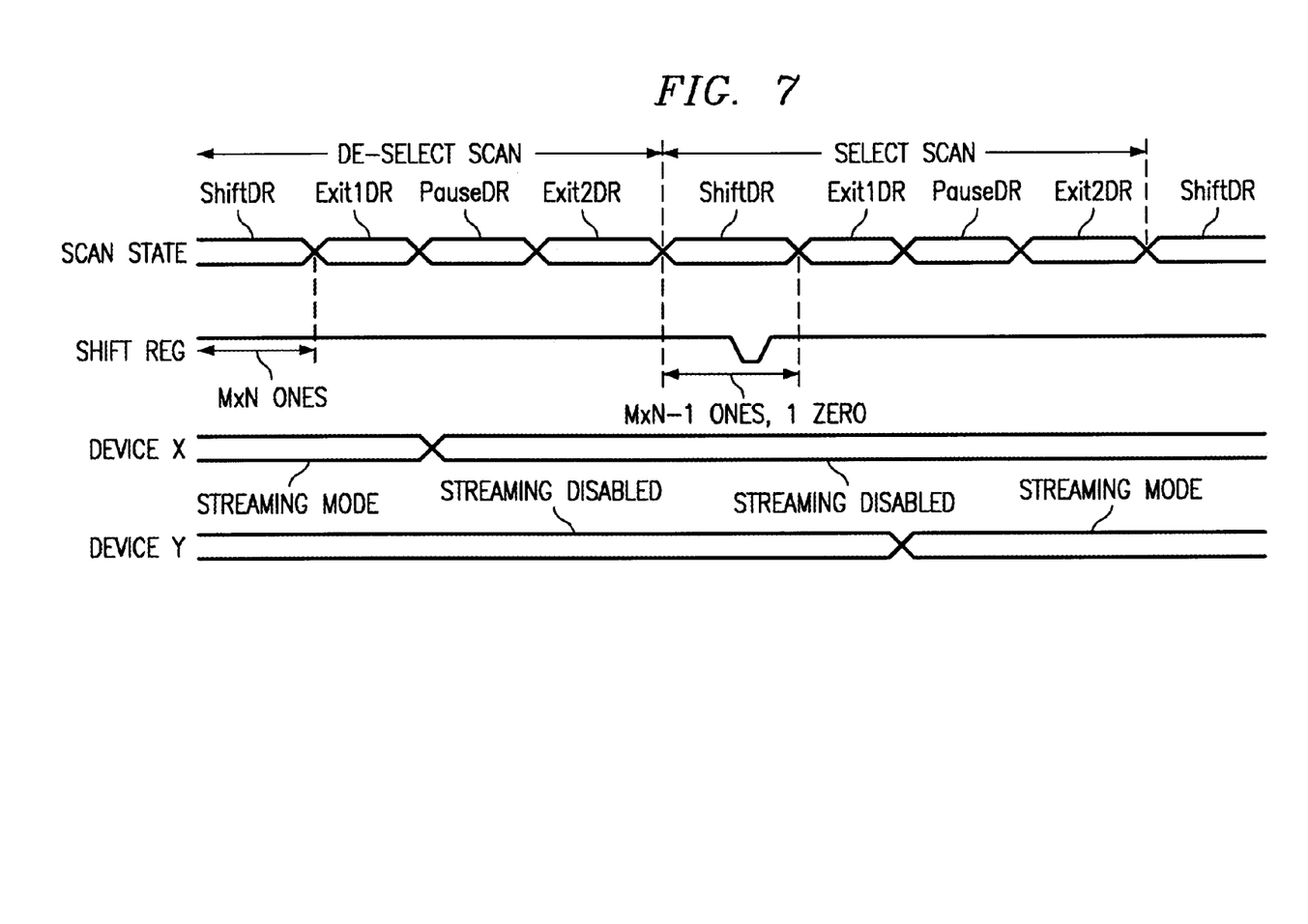
FIG. 7 illustrates the procedure for an improved streaming mode in multiple devices.

Referring to FIG. 7, the waveforms for a technique for improving the use of data streaming is shown. The technique permits the selection of a processor for data streaming without the performance penalty resulting from using an instruction scan to select a new target process for a streaming data mode. When the scan state of the core test control unit changes to SHIFT DR, none of the devices enter the data streaming mode, they all change to bypass mode, reducing the scan chain length to M×N bits. The test and debug controller then issues a select scan which loads a single bit in each device's bypass register and then changes the scan state to PAUSE DR. The scan state is then changed back to SHIFT DR and the device whose bypass register contained a zero enters the data streaming mode, and interprets streaming commands as previously described. To select a different device, the test and debug unit shifts out M×N bits, all logic "1"s, and changes the scan state to PAUSE DR then back to SHIFT DR. This deselects the target device. The select scan is repeated with the single logic "0" positioned in the bypass register of the new target processor.

Figure 8A:
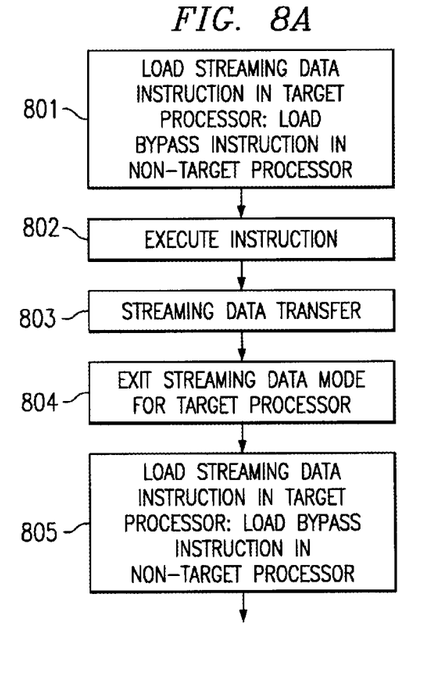
Figure 8B:
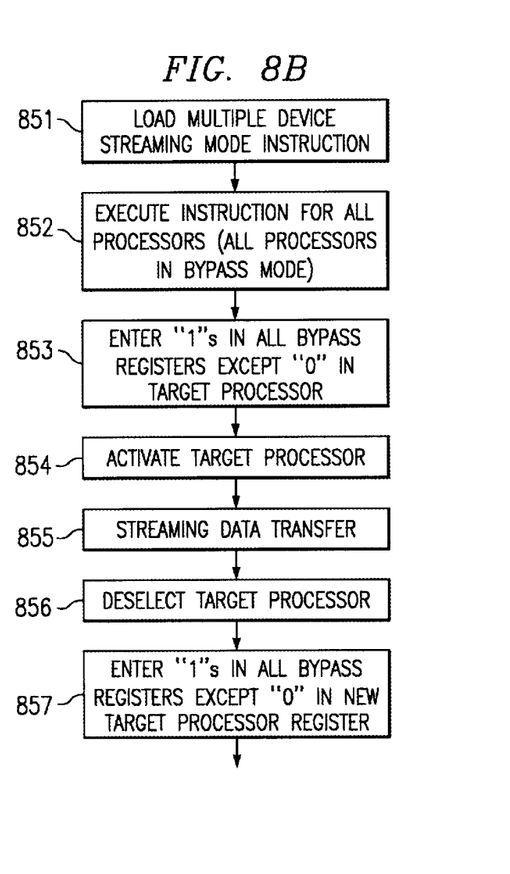
FIG. 8B is a flow diagram of the multiple streaming mode.

Referring to FIG. 8A and FIG. 8B, a comparison of the difference between the streaming mode procedure and the multiple streaming mode procedure is shown. In FIG. 8A, the procedure for the normal streaming mode of operation is shown. In step, 801, the streaming data instruction is loaded in the target processor, while a bypass instruction is loaded into the remaining processors. The instructions are executed, in step 802, with the result that the target processor is placed in a state for executing instructions in the streaming mode of operation. The remaining processors are in a bypass state wherein, when signals are shifted in and out of the scan chain, the signals pass through only a 1-bit shift register for each processor in the chain. In step 803, at least one instruction/command is shifted through the scan chain to the target processor and the results of the instruction or command are placed in the target processor shift register and transferred to the test and debug unit. After activity of the target processor has been completed, the target processor exits the streaming data mode by state change in step 804. In step 805, the streaming data instruction is loaded in the new target processor while the non-target processors receive a bypass instruction.

Referring to FIG. 8B, in step 851, all of the processors have the multiple device streaming instruction loaded therein. In step 852, the multiple device streaming mode instruction is executed. All of the processors are placed in the bypass mode as a result of the multiple device streaming instruction. Logic "1"s are shifted by the test and debug device into all of the processors except for the target processor, the target processor having a logic "0" shifted into the target processor shift register in step 853. As a result of the a logic "1" in the shift register, the processor remains in the bypass mode. As a result of a logic "0" in the bypass shift register, the target processor changes into a state implementing the streaming data transfer mode in step 854. In step 855, the streaming data transfer is implemented, i.e., the entry of instructions/commands into the target processor and the transfer of test data to the can chain. After the streaming data mode activity is complete, the target processor is deselected by a state change in step 856. In step 857, the test and debug unit enters logic "1"s into all of the bypass shift registers except the new target processor. The new target processor receives a logic "0" in the bypass shift register, the logic "0" causing the new target processor to enter streaming data mode. The logic "1"s cause the non-target processors to enter the bypass mode.

2. Operation of the Preferred Embodiment

The present invention reduces the amount of time to change from one processor in a streaming mode of operation to a second processor in the streaming mode of operation. In this mode of operation, instead of loading (M×N−1) processors with bypass instructions and one processor with the streaming mode instruction, all of the processors are loaded with a multiple device streaming (MDS) mode instruction. A series of logic "1"s can be used to place the processors in a bypass state and a series of logic "1"s and a logic "0" place a selected processor in the streaming data mode of operation.

As will be clear to those skilled in the art, although the present invention has been described with respect to a single target processor, a plurality of processors can be target processors when the logic "0" is entered in the bypass shift register.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. In a multi-processor test system having boundary scan functionality, each processor capable of a streaming data mode of operation, each processor comprising:
   a test control unit;
   a register unit including;
      a 1-bit bypass register for use in a bypass node, and;
      an n-bit register for use in data exchange mode;
   wherein the test control unit is responsive to a first instruction for placing the processor in a bypass mode;
   wherein, in the bypass mode, the test control unit is responsive to logic "1" in the bypass register, the logic "1" in the bypass register maintaining the processor in the bypass mode; and
   wherein, in the bypass mode, the test control apparatus is responsive to a logic "0" in the bypass register, the logic "0" in the bypass register causing the processor to enter the streaming data mode of operation.

2. The processor as recited in claim 1 wherein, after a processor has exited from the streaming data mode of operation, a logic "1" in the bypass register causes the processor to enter the by pass mode.

3. The processor as recited in claim 1 wherein a plurality of processors can be in a streaming data mode of operation at the same time.

4. The processor as recited in claim 1 wherein the test control unit implements the JTAG protocol.

5. A method of deselecting a first processor and selecting a second processor to perform a streaming data boundary scan, the method comprising:
   when the first processor has been deselected, entering a first logic signal in all processors to place all processor in a bypass state; and
   applying a second logic signal to the second processor, the second logic signal causing the second processor to implement a streaming data mode of operation; and
   applying a first logic signal to all processors except the second processor, the first logic signal causing all of the processors to which it is applied to remain in the bypass mode of operation.

6. The method as recited in claim 5 further comprising:
   prior to implementing a streaming data mode in any processor, loading a first instruction in each processor, the first instruction resulting in each processor being in a bypass state; and
   entering a first logic signal in all processors except a selected processor, the first logic signal causing all processors having the first logic signal applied thereto remaining in the bypass mode; and
   entering a second logic signal in a selected processor, the second logic signal causing the processor to enter the streaming data mode.

7. The method as recited in claim 5 wherein the processors are responsive to JTAG instruction.

8. A system for testing a multiplicity of processors; the system comprising:
   a test control unit coupled each processor;
   a scan chain, the scan chain including a register unit coupled to each test control unit, the register units coupled in series, each register unit having:
      a 1-bit shift register when the register unit is in a bypass state; and
      an n-bit shift register when the register unit is in a data exchange state, the state of the register unit determined by at least one control signal from the coupled test control unit;
   wherein each test control unit is responsive to a first instruction, the first instruction causing register unit enter the bypass state,
   after entering the bypass state, the test control unit being responsive to a first logic signal in the 1-bit shift register for remaining the bypass state;
   after entering the bypass state, test control unit being responsive to a second logic signal in the 1-bit register for entering the data exchange state.

9. The system as recited in claim 8 wherein the test control units are implemented to be responsive to the JTAG protocol.

10. The system as recited in claim 8 wherein the test control unit includes:
   a data register for entering logic signals in the register unit; and
   an instruction register for receiving logic signals from the register unit.

11. The system as recited in claim 8 further comprising a test and debug unit, the test and debug unit applying signal to the scan chain, the test and debug unit receiving signals from the debug unit.

12. The system as recited in claim 11 wherein the test and debug unit applies timing signals to the processors, the timing signals permitting synchronization between the signals on the scan chain and the test control units.

13. The system as recited in claim 11 wherein the test and debug unit applies control signals to each test and control unit, the control signals determining the state of the test and control unit.

14. The system as recited in claim 13 wherein the states of the test control unit are compatible with the states defined by the JTAG protocol.

* * * * *

UNITED STATES PATENT AND TRADEMARK OFFICE
CERTIFICATE OF CORRECTION

| | | |
|---|---|---|
| PATENT NO. | : 7,464,311 B2 | Page 1 of 1 |
| APPLICATION NO. | : 10/212622 | |
| DATED | : December 9, 2008 | |
| INVENTOR(S) | : Lee A. Larson, Gary L. Swoboda and Mark B. Rix | |

It is certified that error appears in the above-identified patent and that said Letters Patent is hereby corrected as shown below:

Title Page Item (74) "Attorney, Agent, or Firm" delete "Sughrue Mion, PLLC" and insert therefor: --William W. Holloway, W. James Brady, Frederick J. Telecky, Jr.--.

Signed and Sealed this

Seventeenth Day of February, 2009

JOHN DOLL
*Acting Director of the United States Patent and Trademark Office*